United States Patent [19]

Sagawa et al.

[11] Patent Number: 5,208,827
[45] Date of Patent: May 4, 1993

[54] SEMICONDUCTOR LASER DEVICE HAVING A TRANSPARENT WAVEGUIDE AND A LARGE SECOND HARMONIC GENERATION OUTPUT

[75] Inventors: Misuzu Sagawa, Kokubunji; Hiroaki Inoue, Hidaki; Kimio Tatsuno, Kodaira; Masahiro Ojima, Shakujii, all of Japan

[73] Assignee: Hitachi, Ltd., Tokyo, Japan

[21] Appl. No.: 793,647

[22] Filed: Nov. 18, 1991

[30] Foreign Application Priority Data

Nov. 30, 1990 [JP] Japan .................................. 2-337115

[51] Int. Cl.$^5$ ............................................. H01S 3/10
[52] U.S. Cl. .................................. 372/108; 359/328; 372/22; 372/50; 385/14
[58] Field of Search ............... 372/108, 50, 45, 22; 385/14; 359/328

[56] References Cited

U.S. PATENT DOCUMENTS 4,862,473 8/1989 Yano et al. ............................. 372/50

OTHER PUBLICATIONS

T. Taniuchi, et al., "WP6 Miniaturized Light Source of Coherent Blue Radiation", CLEO (Conference of Lasers and Electro–Optics), pp. 196 and 199. (Provided in English).

O Plus E, vol. 103, 1988, pp. 93–97. (Provided in Japanese).

J. A. Armstrong, et al., "Harmonic Generation in GaAs Injection Lasers", Applied Physics Letters, vol. 3, No. 4, Aug. 15, 1963, pp. 68–69. (Provided in English).

Primary Examiner—James W. Davie
Attorney, Agent, or Firm—Fay, Sharpe, Beall, Fagan, Minnich & McKee

[57] ABSTRACT

A semiconductor laser device comprises a semiconductor laser which oscillates a fundamental wave, and a transparent waveguide which is installed substantially in parallel to a direction of a cavity of the semiconductor laser and integral with the semiconductor laser, where second harmonics of the fundamental wave travel through the transparent waveguide and are emitted therefrom. The semiconductor laser and the transparent waveguide have a refractive index in a prescribed range respectively, and an output of second harmonics being significantly high in comparison to the prior art can be obtained.

22 Claims, 5 Drawing Sheets

SEMICONDUCTOR LASER DEVICE HAVING A TRANSPARENT WAVEGUIDE AND A LARGE SECOND HARMONIC GENERATION OUTPUT

BACKGROUND OF THE INVENTION

The present invention relates to semiconductor laser devices, and more specifically to a semiconductor laser device particularly suitable for oscillating rays of short wavelength.

A method including second harmonics generation (hereinafter referred to as "SHG") is known as a means to obtain laser rays of shorter wavelength. At present, the SHG using LN or KDP is realized. In this method, laser rays are focused to the LN or KDP by a lens thereby the SHG is generated. The SHG by Cherenkov radiation of a waveguide of a LiNo3 thin film using a semiconductor laser as a pump source is disclosed in CLEO (Conference of Lasers and electro-optics), pp. 196 and 199, WP6 or 0 plus E, 1988, vol. 103, pp. 93–97. Its structure is shown in FIG. 6. In FIG. 6, numeral 60 designates a LiNO3 substrate, numeral 61 designates incident semiconductor laser rays, numeral 62 designates a proton-exchanged waveguide, numeral 63 designates a transmitted fundamental wave, and numeral 64 designates second harmonics respectively.

On the other hand, it is known that the SHG is generated from the semiconductor laser itself. Since material to constitute the semiconductor laser has a large non-linear coefficient and the luminous density is large within the cavity of the semiconductor laser, this SHG is generated. Regarding the generation of the SHG by the semiconductor laser itself, for example, the Appl. Phys. Lett., vol. 3, pp. 52 reports the SHG generation in the GaAs semiconductor laser. In this case, since absorption of the SHG rays in GaAs is large, rays radiated from the laser facet in the vertical direction are limited to the rays generated in the region within 100 Å from the laser facet, and rays generated in other region are absorbed within the GaAs.

Among the prior art as above described, in the former method, although the alignment of the optical system is important, this is very difficult in the actual state. Consequently, this method lacks reliability and the cost becomes high.

Also in the latter method, since the absorption of the generated second harmonics by the laser material is very large as above described, the output is about $10^{-5}$ times of that of the fundamental wave at most, and it is difficult to obtain a high output.

SUMMARY OF THE INVENTION

An object of the present invention is to solve the above-mentioned problems in the prior art, and to provide a semiconductor laser device having large SHG output in a proper alignment.

In order to attain the foregoing object, in the present invention, a transparency waveguide is installed integral with a semiconductor laser so that the length direction of the transparency waveguide is substantially in parallel to the length direction of a cavity of the semiconductor laser, and materials to constitute these members are selected to satisfy the following three conditions.

That is, when the refractive index of an active layer of the semiconductor laser is made $n_1$ the, refractive index of the transparency waveguide is made $n_2$, and the effective refractive index of the optical waveguide constituted by the semiconductor laser and the transparency waveguide with respect to the fundamental wave (wavelength $\lambda$) is made $n\lambda$, (1) $n_2(\lambda) < n_1(\lambda)$,
(2) $n\lambda < n_2(\lambda/2)$ [condition of Cherenkov radiation],
(3) The transparency waveguide is transparent to second harmonics.

Also the shape of a second harmonics emitting region of the transparency waveguide is made in a conical shape such as a semi-conic shape which is tapered along the emitting direction towards the emitting surface, thereby improving the converging property of the second harmonics.

The functions of the present invention will be described using FIG. 2. In FIG. 2, the wavelength dependency of the refractive index $n_1$ of GaAs and the refractive index $n_2$ of the transparency waveguide is shown when the GaAs is used as the active layer of the semiconductor laser.

As clearly seen from FIG. 2, since the effective refractive index $n\lambda$ of the optical waveguide constituted by the semiconductor laser and the transparency waveguide with respect to the fundamental wave (wavelength $\lambda$) is larger than the refractive index $n_2(\lambda)$ of the transparency waveguide, the fundamental wave travels through the optical waveguide.

Also since the distance between the active layer and the transparency waveguide is sufficiently small, second harmonics generated together with the generation of the fundamental wave hold the Cherenkov radiation angle $\alpha(n_2(\lambda/2)\cos\alpha = n\lambda)$ with respect to the fundamental wave and are radiated into the transparency waveguide. Then the second harmonics travel through the transparency waveguide and are emitted to the outside.

Further, the shape of the second harmonics emitting region of the transparency waveguide is made conical such as a semi-conic shape which is tapered along the emitting direction towards the emitting surface, thereby emitted rays of the second harmonics become parallel to the length direction of the laser cavity and the light converging property is improved.

DETAILED DESCRIPTION OF THE PREFERRED EMBODIMENTS

Embodiment 1

A first embodiment will be described using FIGS. 1a and 1b.

Figure 1A:
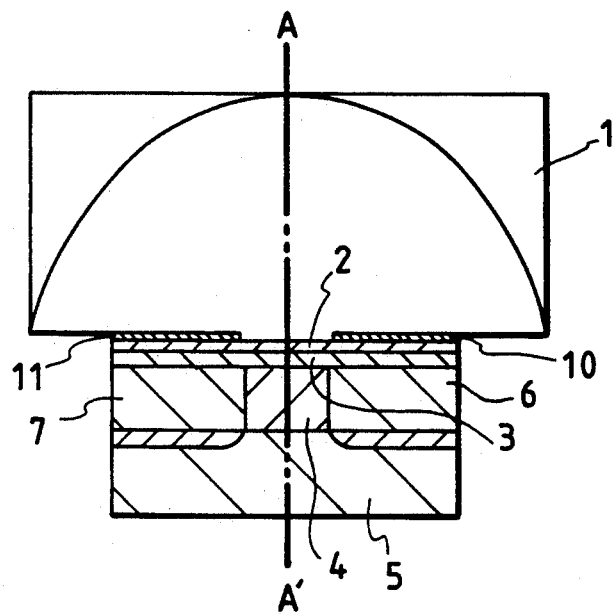
FIGS. 1a and 1b are a front view and its A-A' sectional view respectively showing a first embodiment of the invention.
Figure 1B:
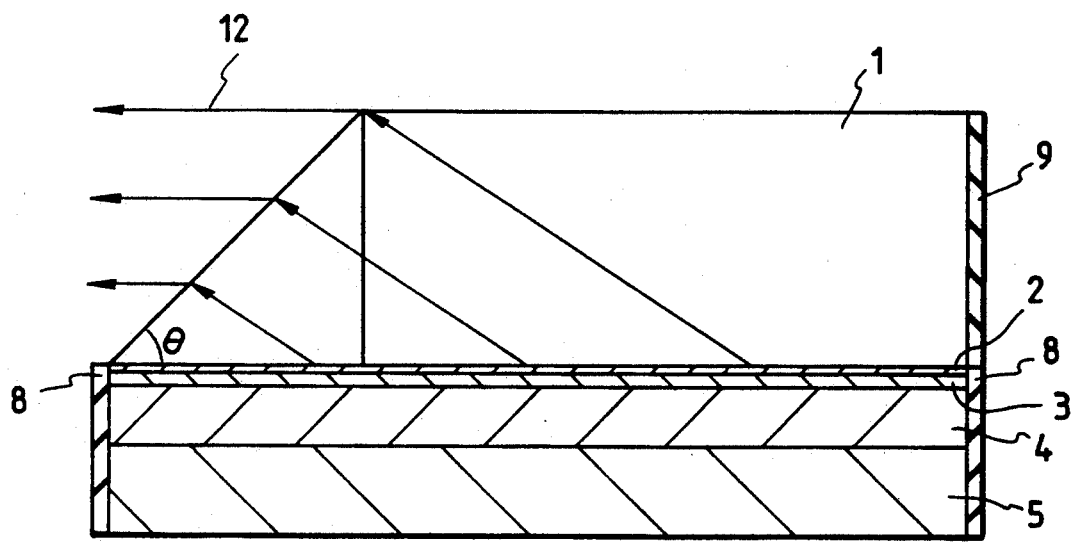
Figure 2:
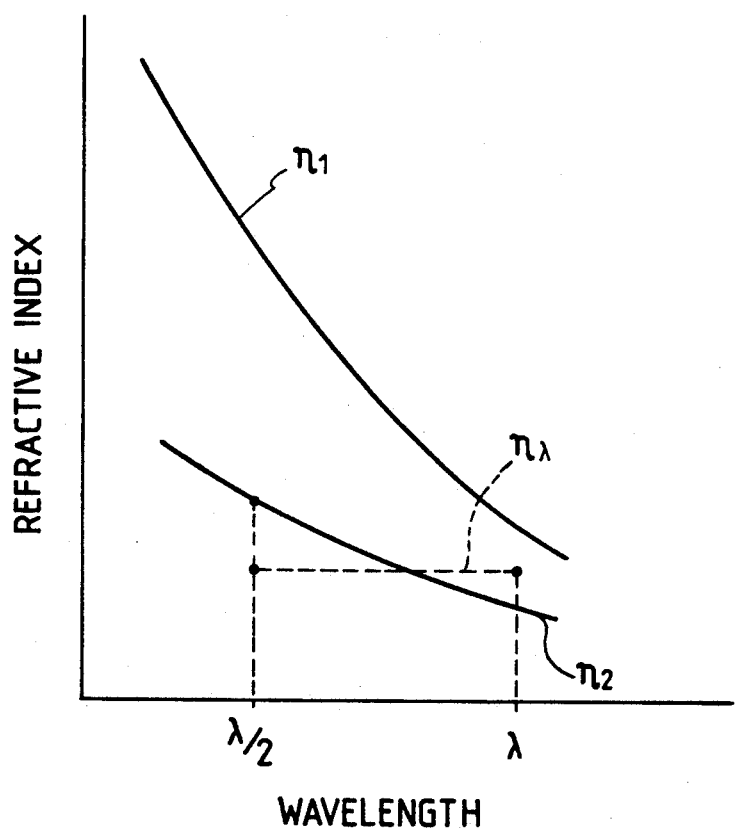
FIG. 2 is a graph showing the wavelength dependency of refractive index of an active layer, refractive index of a transparency waveguide and effective refractive index of a fundamental waveguide.

FIG. 1a is a front view of a semiconductor laser device in this embodiment, and FIG. 1b is a sectional view taken on A-A' of FIG. 1a. Laser rays of the fundamental wave emitted in an active layer 3 generate second harmonics by the non-linear effect of GaAs in the active layer. As shown in FIG. 1a, a transparency waveguide 1 is installed at a position sufficiently close to the active layer 3. Consequently, second harmonics generated at the active layer 3 are subjected to Cherenkov radiation to the transparency waveguide 1 efficiently. Further, one end of the transparency waveguide 1 is of a semiconical shape with an apex angle $\theta$ as shown in FIGS. 1a and 1b so that the second harmonics subjected to Cherenkov radiation become parallel rays as shown.

Next, a method of manufacturing the semiconductor laser device will be described.

An undoped $Al_{.35}Ga_{.65}As$ cladding layer 4, a GaAs active layer 3 and an undoped $Al_{.35}Ga_{.65}As$ cladding 2 are formed in sequence in lamination onto a GaAs substrate crystal 5 of high resistance by MBE (Molecular Beam Epitaxy) methods as are well known. Next, an $SiO_2$ layer and an SiN layer are formed in sequence by CVD (Chemical Vapor Deposition) method as known well. Next, by RIE (Reactive Ion Etching), the required part of the $SiO_2$ layer and the SiN layer is etched and removed, and a diffusion mask remains only on a part on which a stripe is to be formed. An Si film is evaporated on the whole surface using an electron beam evaporation method, and next an unnecessary part of the Si film is removed using lift-off method as known well, and the Si film remains only on the undoped $Al_{.35}Ga_{.65}As$ cladding layer 2 at one side of the diffusion mask. Further the $SiO_2$ film is deposited on the whole surface by thermal CVD method, and diffusion of n type impurity Si is performed in this state. As a result, n type impurity diffusion region 7 is formed as shown in FIG. 1a. And then, the $SiO_2$ film of a part on the opposite side to the side of of Si being diffused is etched, and a window for Zn diffusion is formed. And then, the Zn diffusion is performed and p type impurity diffusion region 6 is performed. At the same time, a stripe is formed. And then, both p, n electrodes are formed by the electron beam evaporation method and the lift-off method as known well. In this case, Au/Cr was used as the p side electrode 10, and Au/Cr/AuGeNi was used as the n side electrode 11. The structure formed in this manner was cleaved into the cavity length 3 mm, and a high reflective film 8 constituted by a multiple film of the $SiO_2$ film with film thickness being ¼ wavelength and the a-Si film was formed on the both obtained end surfaces by the evaporation. Here, the high reflective film 8 means a film having larger reflectivity than that of the cleaved facet (and so forth). Next, the transparency waveguide 1 was fixed to the semiconductor laser by pressing method and both were integrated. An a-Si or TiC was used as a material of the transparency waveguide 1. One end of the transparency waveguide 1 was previously made in a semi-conic shape with an apex angle $\theta$ by grinding, and a film 9 having high reflectivity to second harmonics was provided on other end of the transparency waveguide 1 so that a film having higher reflectivity was formed.

In this embodiment, continuous wave operation under a room temperature was performed at the lasing wavelength 870 nm of the fundamental wave of the formed semiconductor laser device. The threshold current was 1 mA. Wavelength of the second harmonics 12 was 435 nm. Output of the second harmonics was 10 mW with respect to that of the fundamental wave 1 mW. Also the generated second harmonics can be collimated by a lens.

Embodiment 2

A second embodiment will be described using FIGS. 3a and 3b.

Figure 3A:
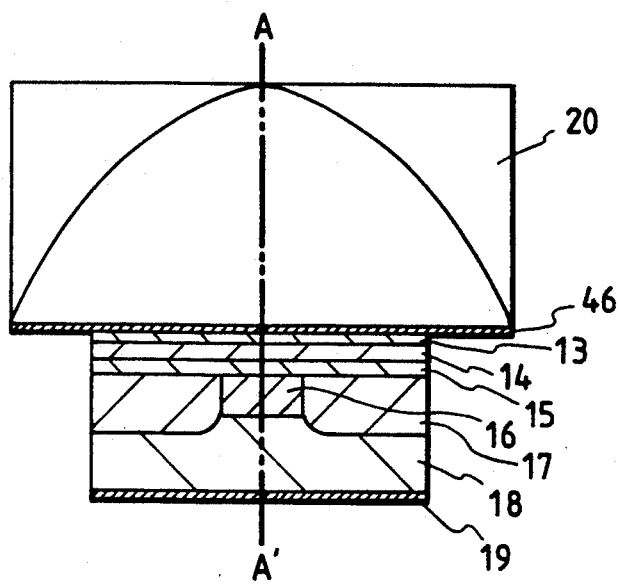
FIGS. 3a and 3b are a front view and its A-A' sectional view respectively showing a second embodiment of the invention.
Figure 3B:
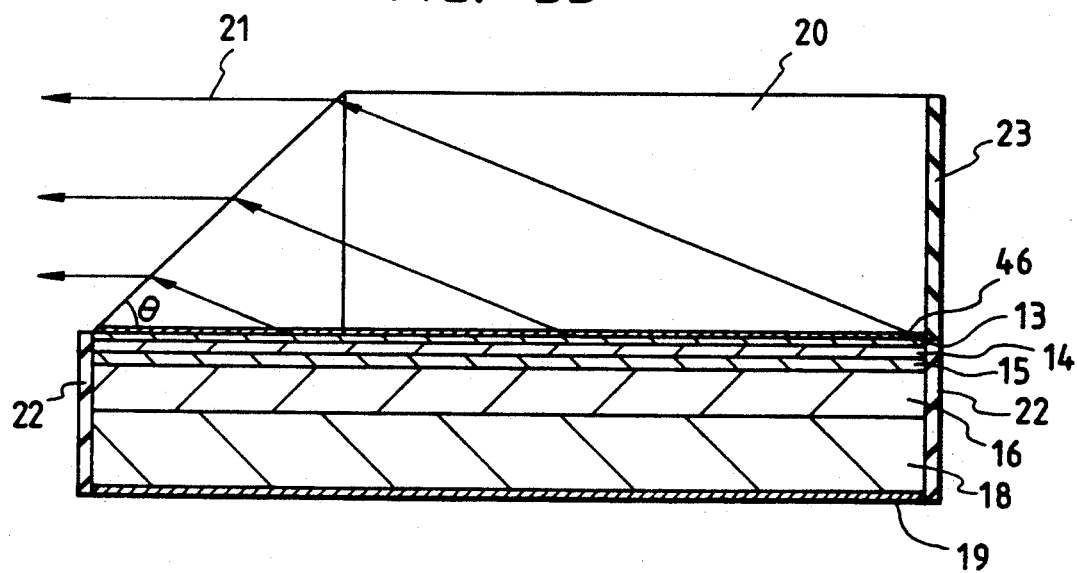

FIG. 3a is a front view of this embodiment, and FIG. 3b is its A-A' sectional view. Laser rays of the fundamental wave emitted in an active layer 14 generate second harmonics by non-linear effect of GaAs in the active layer 14. A transparency electrode is used as n side electrode 46. Consequently, direction of p-n junction can be formed vertically to the active layer plane. The transparency electrode 46 is formed by depositing $SnO_2$, $TiO_2$ or Au by the CVD method. A transparency waveguide 20 is formed at a position sufficiently close to the active layer 14. Consequently, second harmonics generated at the active layer 14 are subjected to Cherenkov radiation to the transparency waveguide 20 efficiently. Further, one end of the transparency waveguide 20 is of semi-conic shape with apex angle $\theta$ as shown in FIGS. 3a and 3b so that the second harmonics subjected to Cherenkov radiation become parallel rays.

Next, the method of manufacturing the semiconductor laser device will be described. A p-type $Al_{.35}Ga_{.65}As$ cladding layer 16 was formed on a p-type GaAs substrate crystal 18 by MOCVD method. Next, the required part of the p-type $Al_{.35}Ga_{.65}As$ cladding layer 16 was etched and removed, using an $SiO_2$ film (not shown) as a mask so that a stripe in mask shape remains. FIG. 3a shows the case that an exposed part of the p-type $Al_{.35}Ga_{.65}As$ cladding layer 16 is completely removed, and etched to attain the surface of the p-type GaAs substrate 18. However, if the depth of the etching is 0.6 $\mu$m or more, the etching need not be performed to attain the p-type GaAs substrate 18. Next, the selective growth was performed using the $SiO_2$ film as a mask, and n-type GaAs light absorbing, current blocking layer 17 was formed by MOCVD method until the etching formed the layer and the groove was filled and the surface became flat. After the $SiO_2$ film used as the mask was removed, by the MOCVD method again, the p-type $Al_{.35}Ga_{.65}As$ cladding layer 15, the GaAs active layer 14 and the n-type $Al_{.35}Ga_{.65}As$ cladding layer 13 were laminated and formed in sequence. And then, the p side electrode 19 made of Au/Cr was formed. The structure formed in this manner was cleaved into the cavity length 3 mm, and a high reflective film 22 constituted by a multiple film of the $SiO_2$ film with film thickness being ¼ wavelength and the a-Si film was formed on the both end surfaces by the evaporation. Next, the transparency waveguide 20 was fixed to the semiconductor laser by pressing method and both were integrated. The transparency waveguide 20 was formed using $ZnGeP_2$ or ZnSe. In place of ZnSe, other semiconductor in II-VI group having the band gap larger than amount corresponding to the wavelength of the fundamental wave may be used. One end of the transparency waveguide was previously made semi-conic shape with apex angle $\theta$ by grinding, and a film 23 having high reflectivity to second harmonics was evaporated on other end of the transparency waveguide. Also, an n-side transparency electrode 46 was formed on a surface including the plane part of semi-conic shape to be made the junction plane with the semiconductor laser.

In this embodiment, continuous wave operation under a room temperature was performed at the lasing wavelength 870 mm of the fundamental wave. The threshold current was 1 mA, and wavelength of the second harmonics 21 was 435 nm. Output of the second harmonics was 10 mW with respect to that of the fundamental wave 1 mW, and the generated second harmonics can be collimated by a lens.

Embodiment 3

A third embodiment will be described using FIGS. 4a and 4b.

Figure 4A:
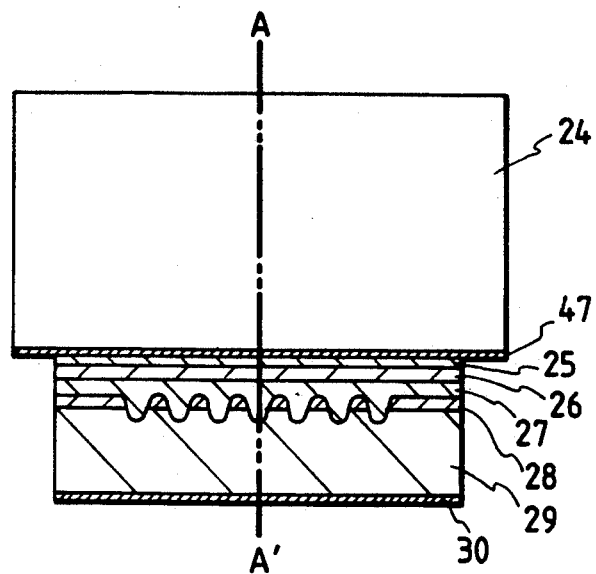
FIGS. 4a and 4b and FIG. 5 are a front view, its A-A' sectional view and a perspective view respectively showing a third embodiment of the invention.
Figure 4B:
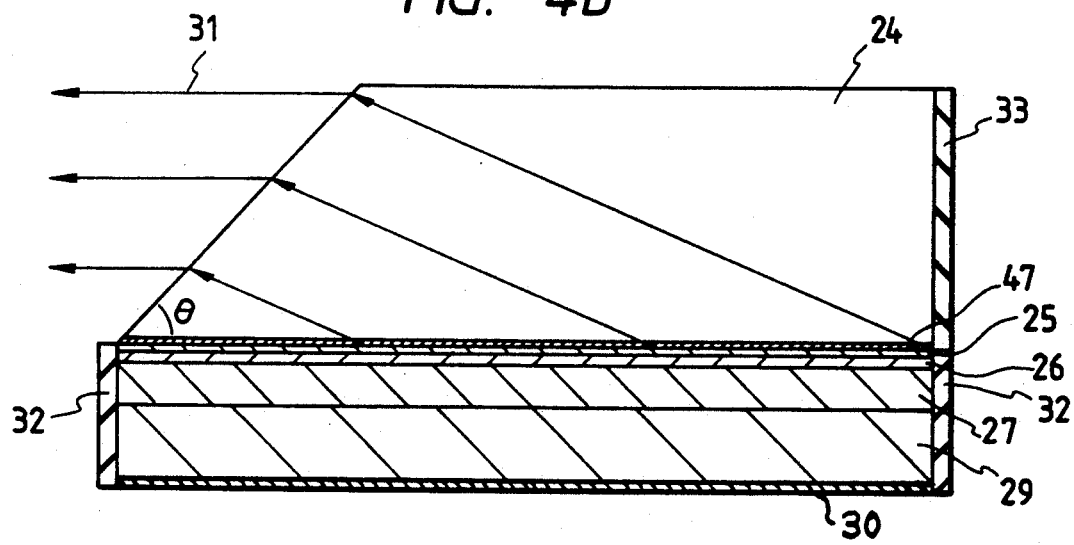

FIG. 4a is a front view of this embodiment, and FIG. 4b is a sectional view taken on A-A' of FIG. 4a. Laser rays of the fundamental wave emitted in an active layer 26 generate second harmonics by non-linear effect of GaAs in the active layer. A transparency electrode 47 is used as an n-side electrode. Consequently, a pn junction can be formed vertically to the plane of the active layer 26. The transparency electrode 47 is formed by depositing $SnO_2$, $TiO_2$ or Au by the CVD method. A transparency waveguide 24 is formed at a position sufficiently close to the active layer 26. Consequently, second harmonics generated at the active layer 26 are subjected to Cherenkov radiation to the transparency waveguide 24 efficiently. Further, one end of the transparency waveguide 24 is of a semi-conic shape with an apex angle $\theta$ as shown in FIGS. 4a and 4b so that the second harmonics subjected to Cherenkov radiation become parallel rays.

Next, the method of manufacturing the semiconductor laser device of this embodiment will be described. First, as shown in FIG. 4a, an n-type GaAs light absorbing, current blocking layer 28 was formed on a p-type GaAs substrate crystal 29 using LPE (liquid phase epitaxy) method as known well. Next, stripes having the stripe width 1-20 $\mu$m, distance between stripe grooves being 0.2-5 $\mu$m and the number being 1-20 were formed by photolithography. The predetermined portion of an n-type GaAs light absorbing, current blocking layer 28 are etched so as to form the stripe grooves which reach to a p-type GaAs substrate crystal 29. And then, a p-side electrode 30 constituted by a laminated film of Au film and Cr film was formed. The element is cleaved into the cavity length 3 mm, and a high reflective film 32 constituted by a multiple film of $SiO_2$ film with film thickness being ¼ wavelength and a-Si film was formed on both end surfaces by evaporation. Next, the transparency waveguide 24 was fixed to the semiconductor laser by a pressing method and both were integrated. As material for the transparent waveguide 24, a laminated body of (semiconductor laser side)/$SiO_2$/SiN/a-Si was used. The refractive index becomes larger as the position becomes remote from the semiconductor laser. However, the refractive index may be different from this embodiment. Also, the thickness of the $SiO_2$ layer and the SiN layer is preferably several hundreds - thousands Å. One end of the transparency waveguide 24 was previously made in a semi-conic shape with apex angle $\theta$ by grinding, and a film 33 having high reflectivity to second harmonics was formed by evaporation on other end of the transparency waveguide 24. Also, an n-side transparency electrode 47 was formed on a surface including the plane part of the semi-conic shape to be made the junction surface with the semiconductor laser.

In this embodiment, continuous wave operation under a room temperature was performed at the lasing wavelength 870 nm of the fundamental wave. Also wavelength of the second harmonics 31 was 435 nm. The threshold current was 3 mA in the case of 3 stripes, 10 mA in the case of 10 stripes, and 20 mA in the case of 20 stripes. Output of the second harmonics was 30 mW with respect to that of the fundamental wave 3 mW in the case of 3 stripes, 100 mW with respect to that of the fundamental wave 10 mW in the case of 10 stripes, and 200 mW with respect to that of the fundamental wave 20 mW in the case of 20 stripes. The generated second harmonics can be collimated by a lens.

As shown in the first-third embodiments, according to the present invention, output of second harmonics can be made $10^{-5}$ times or more of that of the fundamental wave, and can be made more than about $10^{-6}$ times in the prior art.

In addition, the first-third embodiments show the case that the wavelength is about 870 nm. However, the present invention is not limited to this, but can be realized also in the case of the AlGaAs semiconductor laser device with the wavelength 680-890 nm throughout the whole range to enable the continuous wave operation under room temperature.

Any of the conduction type may be reversed with respect to the embodiments (structure that p type be replaced by n type, and n type be replaced by p type).

The invention can be applied not only to material in AlGaAs system used in the embodiments, but also to all materials used in the semiconductor laser device, such as AlGaP, GaInPAs, AlGaInP, AlGaInAs.

Embodiment 4

Figure 5:
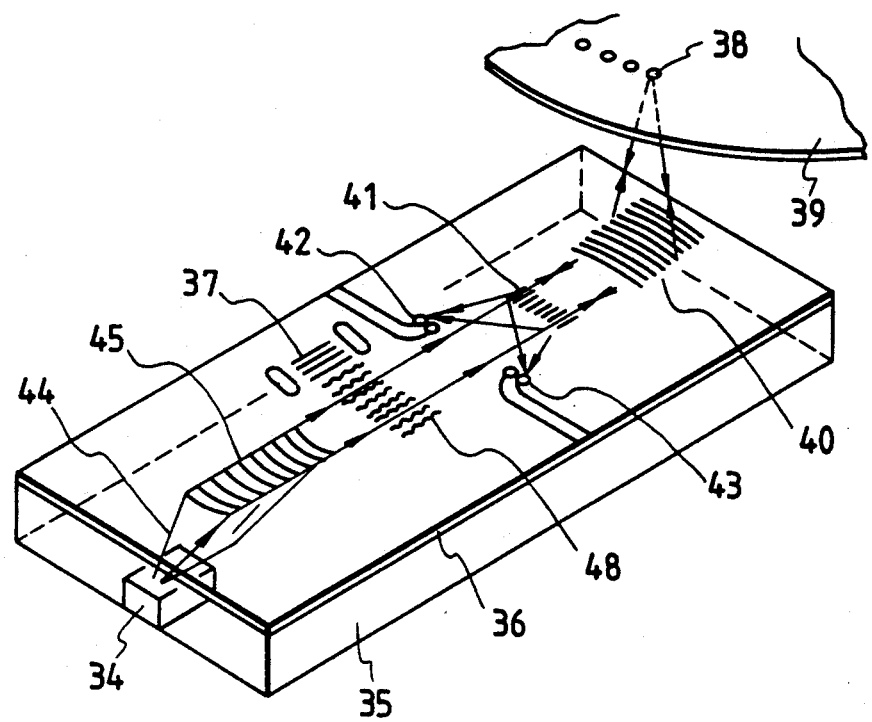
Figure 6:
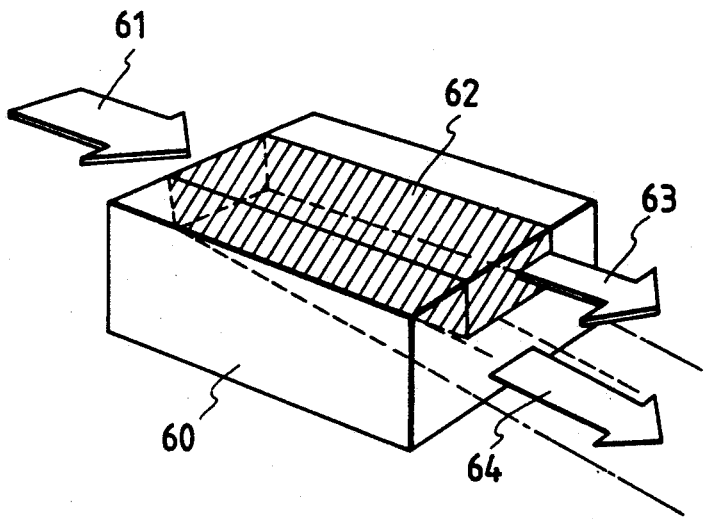
FIG. 6 is a perspective view showing an example of a semiconductor laser device in the prior art performing SHG by Cherenkov radiation.

FIG. 5 shows another embodiment of the present invention, and is a diagram showing constitution of a second harmonics optical head of one chip.

A semiconductor laser element 34 is the same as the element shown in the first embodiment, and this is embedded in one end of a substrate 35 of acousto-optic crystal material constituting a two-dimensional transparency waveguide. On one surface of the substrate 35 is formed a two-dimensional waveguide thin film 36 which guides second harmonics subjected to Cherenkov radiation from the semiconductor laser element 34 and emits them from the other end of the substrate 35. Further, the two-dimensional waveguide thin film 36 is provided with a grating coupler 45 for guiding second harmonics 44 subjected to Cherenkov radiation into the two-dimensional waveguide thin film 36, and a surface acoustic wave generator (more specifically, electrodes for applying high voltage to the two-dimensional waveguide thin film on the crystal surface) 37 for generating surface acoustic wave 48 to diffract parallel beams propagated through the two-dimensional waveguide thin film 36 and to turn the direction of the beams. The other end of the substrate 35 is provided with a grating objective 40 for focusing the parallel beams onto an optical disk 39. Further, a grating beam splitter 41 for processing reflected rays from the optical disk 39, and a pair of detectors 42, 43 are installed in sequence from the side of the grating objective 40.

These members act as follows. The second harmonics 44 subjected to Cherenkov radiation from the semiconductor laser 34 are radiated in the form of cones being overlaid in the traveling direction, and led to the two-dimensional waveguide thin film 36 by the grating coupler 45, and propagated as the parallel beams through the two-dimensional waveguide thin film 36. The surface acoustic wave 48 acts as a diffractive grating and turns the direction of the parallel beams, so that light spots 38 finally obtained can follow train of pits written on the disk 39, i.e., can perform tracking. The beams passing through the surface acoustic wave 46 are focused onto the optical disk 39 by the grating objective 40 and form the light spots 38. The light spots 38 read out signals from train of pits recorded on the optical disk 39. Reflected rays from the optical disk 39 are converged by the grating objective 40 and propagated through the original two-dimensional waveguide thin film 36 in the reverse direction, and pass through the grating beam splitter 41 and comes to the pair of detectors 42, 43, and detect the recorded signals and obtain the auto-focus signal and the tracking signal, and act so that the focus spot always faces the train of pits on the optical disk.

In addition, the semiconductor laser 34 to be used here may be any of the semiconductor lasers used in the first-third embodiments.

As clearly understood from the above description, according to the present invention, rays of shorter wavelength by second harmonics can be obtained in one chip. Consequently, using this chip as a source for reading/writing the optical disk, the amount of information can be obtained in density of four times of the prior art.

What is claimed is:

1. A semiconductor laser device comprising;
   a semiconductor laser having a semiconductor substrate, a first cladding layer, an active layer, a second cladding layer, an electrode disposed on at least an upper surface of said second cladding layer and a cavity comprising said first and second cladding layers and said active layer, for oscillating a fundamental wave; and
   a transparent waveguide disposed on said semiconductor laser substantially in parallel to a length direction of said cavity wherein,
   when a refractive index of the fundamental wave is made $\lambda$, a refractive index of said active layer with respect to the fundamental wave is made $n_i$ ($\lambda$), a refractive index of said transparent waveguide with respect to the fundamental wave is made $n_2$ ($\lambda$), and an effective refractive index of the optical waveguide constituted by said semiconductor laser and said transparent waveguide is made $n_2$, it follows that $$n_2 (\lambda) < n_1 (\lambda)$$

$$n_2 < n_2 (\lambda/2)$$

thereby second harmonics of the fundamental wave travel through said transparent waveguide and are emitted therefrom.

2. The semiconductor laser device as set forth in claim 1, wherein the second harmonics emitted through said transparent waveguide to the outside are $10^{-5}$ times or more of that of the fundamental wave.

3. The semiconductor laser device as set forth in claim 1, wherein a second harmonic emitting region of said transparent waveguide is of conical shape and tapered towards an emitting direction.

4. The semiconductor laser device as set forth in claim 3, wherein the conical shape is a semi-conic shape.

5. The semiconductor laser device as set forth in claim 1, wherein said semiconductor laser has a double-hetero junction structure formed on said semiconductor substrate.

6. The semiconductor laser device as set forth in claim 5, wherein said semiconductor substrate is a high resistance semiconductor substrate, and the double-hetero junction has a p-side electrode and an n-side electrode formed interposing an emitting region therebetween in the cavity length direction of said semiconductor laser, and said p-side electrode and said n-side electrode contact with a cladding layer at the remote side to said semiconductor substrate.

7. The semiconductor laser device as set forth in claim 6, wherein said n-side electrode is a transparency electrode.

8. The semiconductor laser device as set forth in claim 7, wherein said transparency electrode is made of $SnO_2$, $TiO_2$ or Au.

9. The semiconductor laser device as set forth in claim 6, wherein the emitting region of said semiconductor laser is formed in a plurality of stripes extending in the cavity length direction of said semiconductor laser.

10. The semiconductor laser device as set forth in claim 1, wherein said transparent waveguide comprises a laminated layer of a layer having a refractive index larger than an effective refractive index of said transparent waveguide to the second harmonics and a layer having a refractive index smaller than the effective refractive index.

11. The semiconductor laser device as set forth in claim 1, wherein said transparent waveguide is selected from the group consisting of a-SiTiO$_2$, ZnGeP$_2$, ZnSe and II-VI group semiconductors having a band gap larger than an amount corresponding to a wavelength of the fundamental wave.

12. The semiconductor laser device as set forth in claim 1, wherein said transparent waveguide comprises a laminated layer of SiO$_2$ film, SiN film and a-Si film.

13. The semiconductor laser device as set forth in claim 1, wherein a film having higher reflectivity than that of a cleaved surface is formed on both end surfaces of said semiconductor laser.

14. The semiconductor laser device as set forth in claim 1, wherein a film raising reflectivity of second harmonics is installed to said transparent waveguide at a side opposite to a second harmonics emitting region.

15. The semiconductor laser device as set forth in claim 2, wherein a second harmonic emitting region of said transparent waveguide is of conical shape tapered towards the emitting direction.

16. The semiconductor laser device as set forth in claim 2, wherein said semiconductor laser has a double-hetero junction structure formed on said semiconductor substrate.

17. The semiconductor laser device as set forth in claim 7, wherein the emitting region of said semiconductor laser is formed in a plurality of stripes extending in the cavity length direction of said semiconductor laser.

18. The semiconductor laser device as set forth in claim 2, wherein said transparent waveguide comprises a laminated layer of a layer having a refractive index larger than an effective refractive index of said transparent waveguide to the second harmonics and a layer having a refractive index smaller than the effective refractive index.

19. The semiconductor laser device as set forth in claim 2, wherein said transparent waveguide is selected from the group consisting of a-SiTiO$_2$, ZnGeP$_2$, and ZnSe and II-VI group semiconductors having a band gap larger than an amount corresponding to wavelength of the fundamental wave.

20. The semiconductor laser device as set forth in claim 2, wherein said transparent waveguide comprises a laminated layer of $SiO_2$ film, SiN film and a-Si film.

21. The semiconductor laser device as set forth in claim 2, wherein a film having higher reflectivity than that of a cleaved surface is formed on both end surfaces of said semiconductor laser.

22. The semiconductor laser device as set forth in claim 2, wherein a film raising reflectivity of second harmonics is installed to said transparent waveguide at a side opposite to a second harmonics emitting region.

* * * * *

UNITED STATES PATENT AND TRADEMARK OFFICE
CERTIFICATE OF CORRECTION

PATENT NO. : 5,208,827
DATED : May 4, 1993
INVENTOR(S) : Misuzu Sagawa, et al.

It is certified that error appears in the above-identified patent and that said Letters Patent is hereby corrected as shown below:

Claim 1, column 7, line 46, delete "$n_2$" and substitute therefor -- $n_\lambda$ --; and, line 48, delete "$n_2 < n_2 (\lambda/2)$" and substitute therefor -- $n_\lambda < n_2 (\lambda/2)$ --.

Signed and Sealed this

Twenty-second Day of February, 1994

*Attest:*

BRUCE LEHMAN

*Attesting Officer*     *Commissioner of Patents and Trademarks*